United States Patent [19]

Halpern

[11] Patent Number: 5,650,197

[45] Date of Patent: Jul. 22, 1997

[54] JET VAPOR DEPOSITION OF ORGANIC MOLECULE GUEST-INORGANIC HOST THIN FILMS

[75] Inventor: Bret Halpern, Bethany, Conn.

[73] Assignee: Jet Process Corporation, New Haven, Conn.

[21] Appl. No.: 538,967

[22] Filed: Oct. 5, 1995

Related U.S. Application Data

[62] Division of Ser. No. 212,016, Mar. 11, 1994, abandoned.

[51] Int. Cl.[6] .............................. C23C 16/00; C23C 14/00
[52] U.S. Cl. .................................. 427/248.1; 427/255.7; 437/225
[58] Field of Search ........................... 427/248.1, 255.7; 437/225

[56] References Cited

U.S. PATENT DOCUMENTS

| | | |
|---|---|---|
| 4,788,082 | 11/1988 | Schmitt . |
| 5,256,205 | 10/1993 | Schmitt et al. . |
| 5,356,673 | 3/1991 | Schmitt et al. . |

OTHER PUBLICATIONS

"Handbook of Deposition Technologies for Films and Coatings", by Rointan F. Bunshah, et al, Noyes Publishing Company, Park Ridge, New Jersey, 1st edition, 1982, 2nd edition, 1994.

H. Kogelnik and C.V. Shank, Applied Physics Lett., 18 152 (1971).

U.S. application No 07/521,100, Schmitt et al., filed May 9, 1990, Microwave Plasma Assisted Gas Jet Deposition of Thin Film Material.

H.P. Weber and R. Ulrich, Applied Physics Lett., 19 38 (1971).

I.P. Kaminow, L.W. Stulz, E.A. Chandros, and C.A. Pryde Applied Optics 11 1563 (1972).

R.L. Fork and Z. Kaplan Appl. Phys. Letters 20 472 (1972).

U.S. application No. 07/670,693, Schmitt et al, filed Mar. 18, 1993, An Evaporation System for Gas Jet Deposition of Thin Film Materials.

K.H. Drexhage in "Dye Lasers", F.P. Schaefer, ed., Springer–Verlag, 1973, chapter 4.

D. Avnir, V.R. Kaufman, and R. Reisfeld, J. Non–Crystalline Solids 74 395 (1985).

D. Levy and D. Avnir, Unconventional Photoactive Solids 2nd Int. Conf. Photoact. Solids, Cleveland, OH, 1989; H. Scher, editor; p. 193.

J.D. Mackenzie in Ultrastructure Processing of Ceramics, Glasses and Composites, L.L. Hench and D.R. Ulrich, eds., Wiley–Interscience, 1984, chapter 3.

D. Lo, J.E. Parris, and J.L. Lawless Applied Physics B55, 365 (1992).

*Primary Examiner*—Richard Bueker
*Attorney, Agent, or Firm*—McCormick, Paulding & Huber

[57] ABSTRACT

A host-guest jet vapor deposition system uses sonic jets and moving substrates to produce host-guest films in which complex organic molecules are trapped in hard, inorganic hosts. The system is capable of film fabrication at high rate and room temperature. Guest molecule concentrations are large and film quality is excellent. Films made in accordance with the present invention have applications in optics and electronics.

8 Claims, 4 Drawing Sheets

JET VAPOR DEPOSITION OF ORGANIC MOLECULE GUEST-INORGANIC HOST THIN FILMS

This application is a Divisional of U.S. patent application Ser. No. 08/212,016 filed Mar. 11, 1994, now abandoned.

The invention described herein was made with U.S. government support under National Science Foundation grant number III-9303207 and the Government may have rights herein.

TECHNICAL FIELD

The present invention relates to deposition of "host-guest" thin film materials for applications in electronics and photonics, and in particular to an apparatus and method for making organic guest - inorganic host films by Jet Vapor Deposition (JVD) of thin films.

CROSS REFERENCE TO RELATED APPLICATIONS

Some of the subject matter herein is disclosed and claimed in the following U.S. patent and pending U.S. patent applications, all of which are incorporated herein by reference.

| U.S. Pat. No. 4,788,082 | U.S. Pat. application No. 06/888,590 |
|---|---|
| U.S. Pat. No. 5,236,205 | U.S. Pat. application No. 07/817,518 |

BACKGROUND OF THE INVENTION

The critical role of thin films in modern electronic and photonic devices is well established. Useful films include a wide range of metals, semiconductors and insulators, in simple, multicomponent, and multilayer form. An impressive number of established film deposition methods and materials are amply described in the "bible" of the field, "Handbook of Deposition Technologies for Films and Coatings", 1994, edited by Rointan F. Bunshah.

However, one intriguing class of thin film has largely eluded efforts at economic and efficient synthesis up to the present time. This is the class of "doped" or "host-guest" film in which organic molecule guests are incorporated in hard, ceramic, inorganic hosts. Doping is an important way of modifying the properties of materials; examples are transistors in electronics, and lasers in optics. The lure of doping hard coatings with complex organic molecules is particularly strong. Because of their unusual and varied electronic structure, and their nearly infinite variety of chemical properties, organic molecule dopants raise many fascinating possibilities for thin film applications that cannot be realized in other ways. The ability to make these doped films opens the way to nearly limitless synthetic combinations of organic and inorganic chemistry with application to nonlinear optical-electronic integrated circuits, thin film lasers, chemical sensors, and novel decorative films.

There have been several approaches to doping thin films with complex organics. Dye molecules can be dissolved in liquid plastics or polymers which are then painted on substrates and solidified. However, this is a slow process, not compatible with high throughput modern semiconductor, vapor deposition technology. Of equal importance, the properties of plastics or polymers may not be as desirable in a host as those of hard ceramics such as oxides; photoinduced reaction of dye and matrix is one possible side effect, and thermal degradation is another. Luminescent organic molecules have indeed been trapped in low melting glasses such as boric acid, and in sol-gel oxide matrices, but these materials also have limitations. The sol-gel process involves multiple, time consuming steps, employs solvents hazardous to health, and lends itself poorly to vapor-based integrated circuit manufacture.

The majority of established deposition processes fall into two categories, chemical vapor deposition (CVD) and physical vapor deposition (PVD); both have disadvantages. In CVD, the substrate must be kept hot in order to reactively deposit an oxide host while the organic guest co-deposits; thermally fragile organics are unlikely to survive in CVD. In PVD, high vacuum requirements limit throughput and impede continuous operation; organics are not regarded as compatible with high vacuum systems, and some PVD methods involve plasmas that are detrimental to organic molecule stability. It is difficult to envision either a CVD or PVD approach to organic-ceramic host-guest films that is simple, reliable, fast and versatile.

It is therefore advantageous to have a method and apparatus for depositing organic-ceramic host-guest films based on vapor deposition. It is similarly advantageous to have a method and apparatus of the foregoing type capable of not only trapping a variety of organic molecules in ceramic host, but doing so at an economically attractive rate over substantial areas and on useful substrates. The present method and apparatus is drawn towards such an invention.

SUMMARY OF THE INVENTION

An object of the present invention is to provide a system capable of depositing organic guest-inorganic host thin films at high rate and at low temperature.

Another object of the present invention is to provide a system of the foregoing type which allows for a large number of guest-host combinations.

Still another object of the present invention is to provide a system of the foregoing type which is compatible with vapor based integrated circuit manufacture.

Another object of the present invention is to provide a system of the foregoing type which needs no toxic film precursors or solvents.

Yet another object of the present invention is to provide a system of the foregoing type which allows for room temperature film deposition, leaving sensitive substrates and organic guests undamaged.

According to the present invention, a system for depositing organic guest-inorganic host films upon a substrate has the following components: 1) a vacuum chamber with one or more ports allowing access to the chamber interior 2) a vacuum pump for evacuating gas from the chamber 3) a positioning mechanism for locating and moving a substrate within the chamber 4) one or more jet vapor sources, affixed to the chamber ports, for admitting carrier gas and entrained condensible or reactive species to the chamber.

DESCRIPTION OF THE PREFERRED EMBODIMENT

Figure 1:
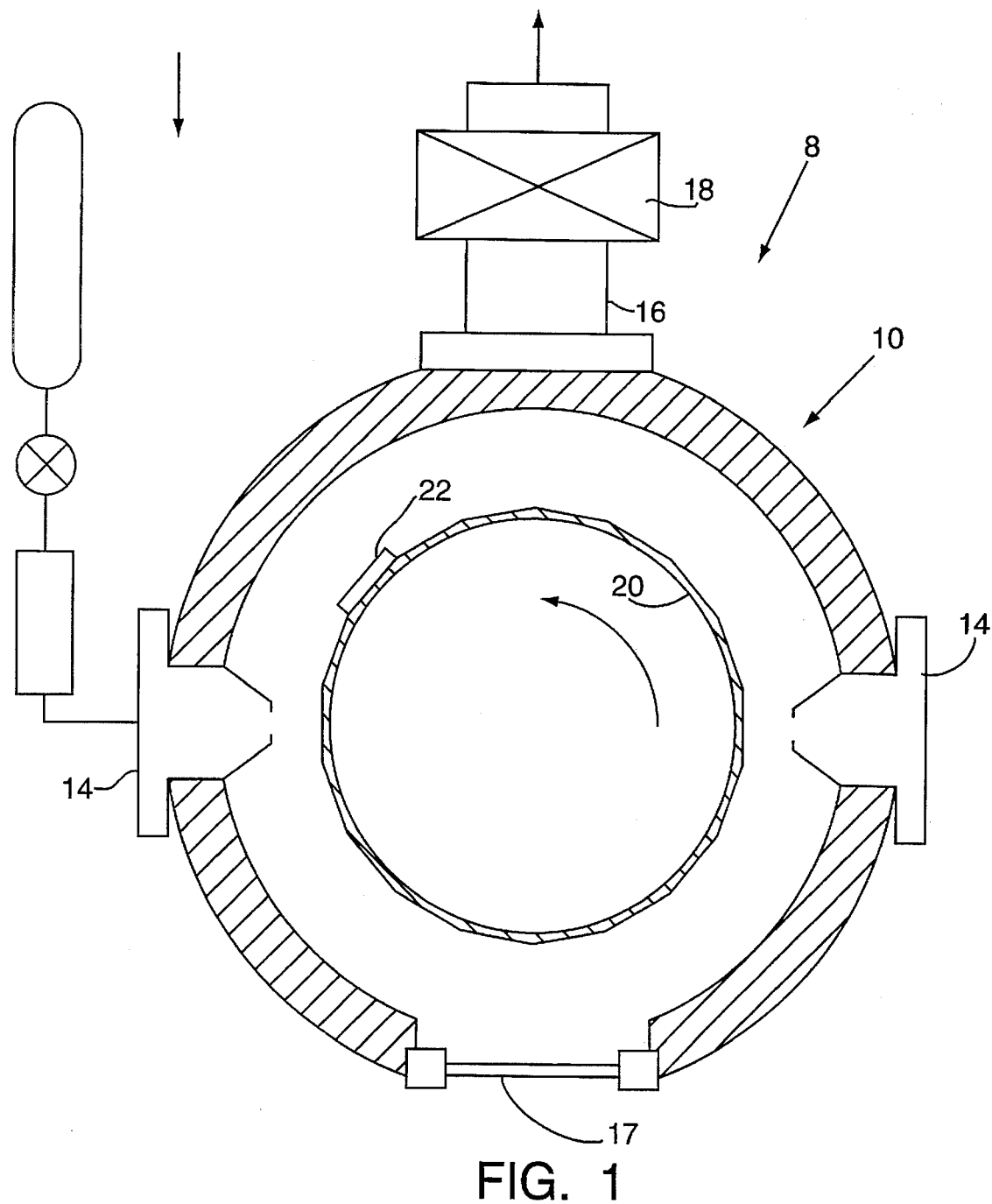
FIG. 1. is a top view of the jet vapor deposition system used in this invention.

Jet vapor deposition (JVD) uses collimated sonic jets in low vacuum to carry condensible species and deposit films. JVD jet sources operate over a range of several torr to tens of torr, accommodate diverse vapor generation schemes, and transport film species efficiently to substrates at near-sonic speeds. Jet collimation and high speed lead to fast, efficient, economic deposition. Single or multiple jets in combination with "mobile substrates" enables production of simple, multilayer, and complex multicomponent film structures over large or small areas. Film constituents may be selected almost at will from metals, semiconductors, oxides, nitrides, dielectrics and polymers. JVD is thus a general, high-rate gas dynamic approach to film deposition that provides distinctive options not accessible to physical vapor deposition (PVD) and chemical vapor deposition (CVD).

In brief, a jet of inert carrier gas propels condensible atoms, molecules or clusters to a substrate downstream. The jet is formed by a nozzle of large exit diameter, several mm to 2 cm, supplied with He or $H_2$ carrier gas, and incorporated in a fast flow, low pressure system. Steady state flow and pressure are sustained by mechanical pumps with speeds ranging from 400 to 20,000 liters/minute; depending on nozzle size, this results in a nozzle pressure $P_n \sim 1$–10 torr, and a downstream pressure $P_d \sim 0.1$–1 torr. For $P_n/P_d > 2$ critical flow obtains; a well collimated jet emerges from the nozzle at the speed of sound, $\sim 10^5$ cm/sec for He.

A vapor source, based on thermal evaporation, glow discharge sputtering, microwave discharge chemistry, laser vaporization, etc, is placed just upstream of the nozzle exit. Evaporated atoms or molecules are swept out of the nozzle by the sonic carrier flow and intercepted by a substrate downstream. On a stationary substrate one observes rapid formation of a bright disc of a deposit comparable in area to that of the jet. The boundary of the deposit is sharp; the deposit is non-uniform, however, being thickest at the center.

To obtain uniform deposits over larger areas, either the substrate or the jet can be moved. One choice is to mount the substrate on a "carousel" which can both spin and oscillate along its own axis. The carousel motion is typically computer controlled, so that a variety of motions can be programmed. If the carousel is stationary, atoms deposit in a circular zone as described above. If the carousel spins, the deposit forms a band around it; if the carousel oscillates along its axis as well, its entire surface, (and that of every substrate on it), is efficiently coated to uniform depth.

The versatility of JVD arises in several ways. First, in low vacuum the jet is collimated, and deposition is localized; film growth is fast and efficient. Second, several different jets can be arrayed around the fast moving carousel and substrates; this "multiple jet, mobile substrate" strategy opens a powerful route to reactive synthesis of complex films at submonolayer level but at high rate.

The synthetic capability of JVD is related to the pressure range of jet operation: $\sim 1$–10 torr in the nozzle, and $\sim 0.1$–1 torr downstream. At these pressures the jet is collimated and nearly cylindrical as verified by chemiluminescent techniques which make the jet contours visible. Radial diffusion, which tends to flare the jet, is outweighed by near-sonic transport down the jet axis, so that atom deposition is localized and efficient. At much lower pressures, radial diffusion would give a divergent jet; entrained vapor would bypass the substrate and reduce deposition efficiency. High vacuum PVD processes such as thermal evaporation do not have JVD's economy of material usage; they give "line of sight" deposition but vapor is wasted in wrong directions. Much higher pressure, however, risks gas phase cluster formation and particle growth at high vapor inputs; film quality can then be altered. In JVD, clustering will not occur at prevailing pressures and transit times; only single atoms or molecules reach and condense on the substrate even at high deposition rate. JVD's jet sources accordingly operate in an optimal regime: the pressure is high enough to collimate the jet and realize high deposition rates, but low enough to insure arrival of single atoms and molecules at the substrate. Sonic flow means that the vaporization mechanism within a nozzle is unaffected by downstream reactive species. For example, refractory metal sputtering targets inside a nozzle are protected even from. downstream atomic oxygen. Jet collimation is particularly advantageous for synthesis. Since the jets do not interfere in the gas phase, a moving substrate can reactively "sum" the deposition fluxes from several jets to give complex multicomponents.

JVD thus combines high speed gasdynamics with inexpensive, "fast flow, low vacuum" technology to give synthetic versatility, convenient operation and economic throughputs. The present invention uses JVD in a novel process and apparatus to make organic guest-inorganic host films for electronic and optical applications at high rate and low temperature.

In the present invention, the jet sources are of sufficient number and of the proper design to supply the organic molecule guests, molecules of the host, or the components enabling reactive synthesis of the host for co-deposition with the guest. The organic guest jet source is designed to supply a steady, high flux without decomposition of thermally fragile organic molecules.

The positioning apparatus is capable of moving a substrate in such a way that it can sample the flux from any jet. Furthermore, the motion is such as to enable control of the substrate residence time or exposure time in any jet and thereby the extent of deposition of material from any jet. The resulting film product is the aggregate of components contributed by each jet. The relative proportions and spatial positions of each component in the film are determined by the relative jet fluxes and by the residence times determined by the substrate positioning system.

Figure 2:
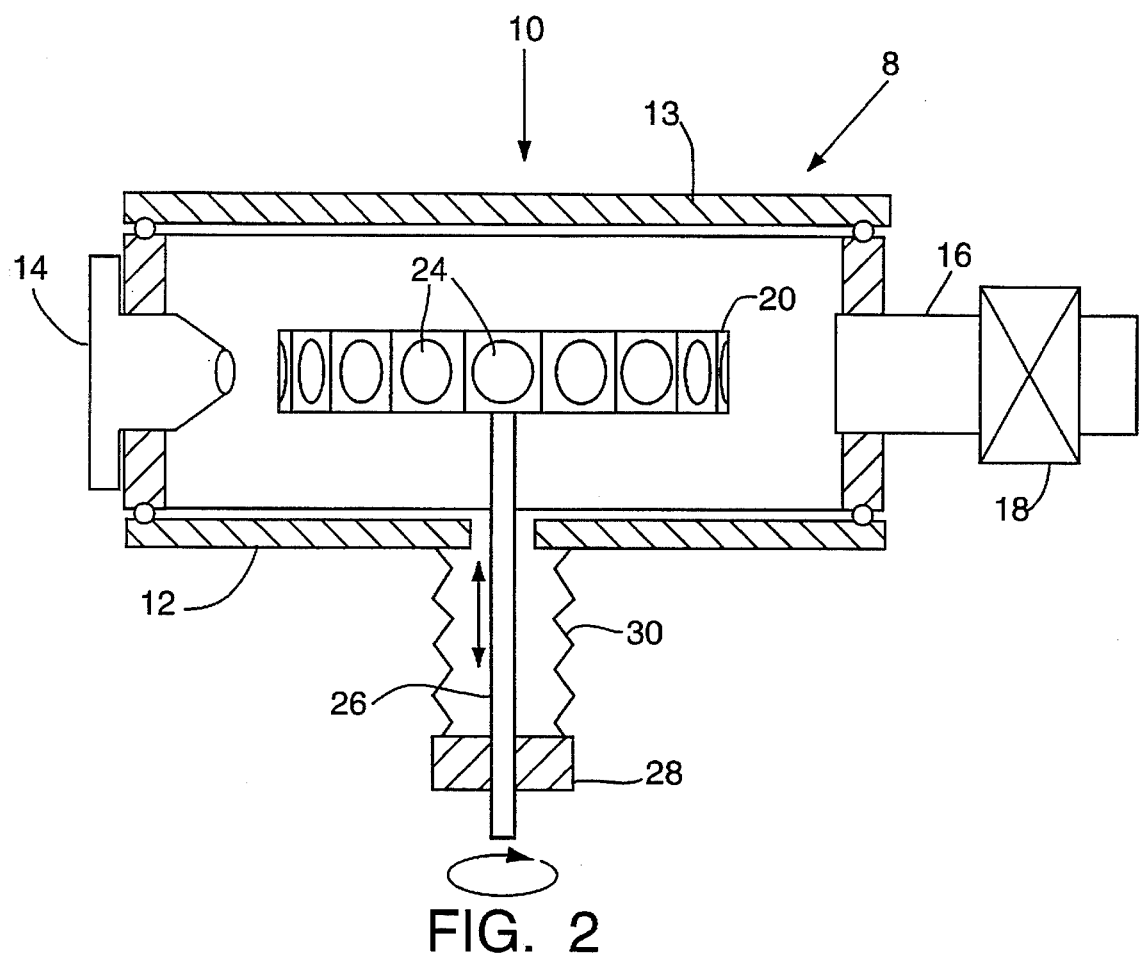
FIG. 2. is a side view of the jet vapor deposition system used in this invention.

As shown in FIG. 1, and FIG. 2, a system provided according to the present invention 8 includes a JVD deposition chamber 10 which is a hollow cylinder made from aluminum. There is some freedom in the choice of diameter, height and wall thickness. An exemplary chamber has outer diameter 19 inches, height 6 inches, and wall thickness 1 inch, but chambers with smaller diameter and height can be used as well.

The chamber rests on an aluminum baseplate 12 and has a removable aluminum cover 13. This chamber has eight machined ports 14 spaced equidistantly around its circumference, which accommodate standardized 4" flanges; two are shown in FIG. 1. Rubber O-rings provide seals for baseplate, cover, and flanges mounted on the ports. One port is connected to a pumping line 16 which can be closed with a butterfly valve 18. A glass viewport 17 is also shown in FIG. 1.

In the above system, the substrate mounting and motion system is a drum shaped "carousel" 20. It is constructed from a disc 35 cm in diameter and 1 cm thick, into which are machined 18 flat sides each 6 cm long. Square plates 22 6 cm×6 cm×3 mm are attached to each of the eighteen sides, perpendicular to the plane of the disc. Pockets machined into these plates support the substrates so that the substrate surface is exposed to the jets. The substrates 24 can be of several materials and shapes: typical substrates are 2" silicon wafers, glass plates, and microscope cover glasses. The carousel also contains a centered steel axle 26 and is mounted in the deposition chamber so that its axle is coincident with the chamber axis. The carousel has two degrees of freedom of motion: translation back and forth along the axis, and spinning around the axis. Rotation is effected through a ferrofluidic seal 28 or O-ring seal, and translation is effected through a bellows 30 or O-ring seal, mechanisms familiar to those skilled in the art. Motive power is supplied to the by external stepper motors. It should be emphasized that smaller or larger carousels can be used, consistent with the chamber size, without altering the principles of the present invention.

Figure 3:
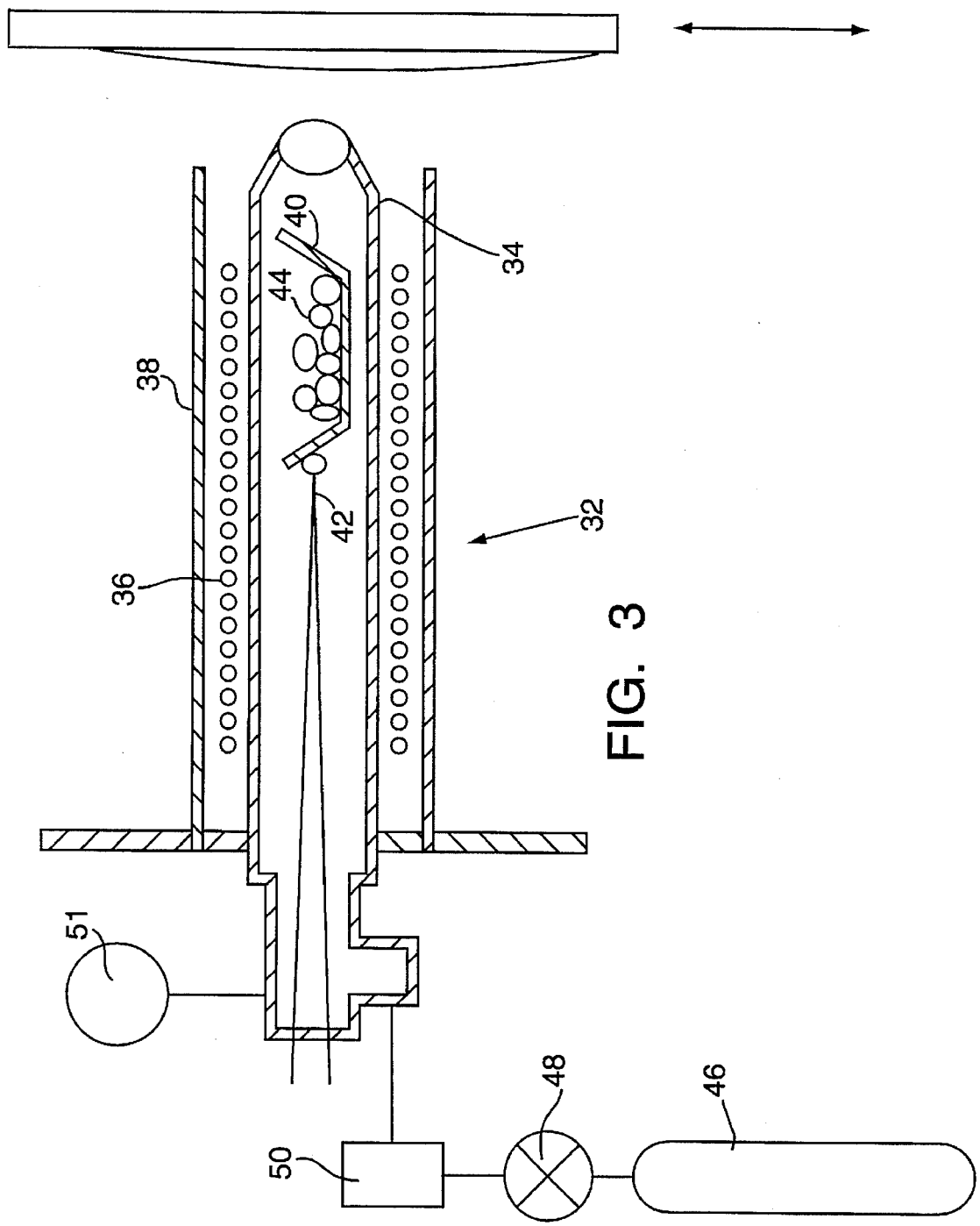
FIG. 3. shows a jet vapor source of organic molecule guests.

The organic molecule jet vapor source 32 is shown in FIG. 3. It comprises a glass, quartz or ceramic tube which defines the nozzle 34, a heating coil 36, an optional metal foil radiation shield 38, an organic molecule reservoir 40 made from Pt or other unreactive metal foil, and a thermocouple 42. (Note: well known, conventional chemical abbreviations are often used herein in place of full text names.) The thermocouple is contained in a small diameter alumina tube (not shown in FIG. 3) mounted along the nozzle axis. The organic reservoir is mounted on the end of the thermocouple assembly so that it is located near the nozzle exit, but does not touch the sides of the nozzle.

The reservoir is loaded with crystalline or powdered organic material 44 as most organics are in the form of fine powders. The metal foil reservoir is shaped to nearly completely enclose the fine powder, with small openings that allow escape of vapor by diffusion while avoiding loss of powder to fast moving gas. Typical dimensions are: nozzle diameter, 1 cm, nozzle orifice diameter, 4 mm, nozzle length, 10 cm. The organic molecule jet vapor source is supplied with high purity helium or other inert carrier gas from a high pressure cylinder 46. Flow is regulated by a needle valve 48. A commercial getter 50 such as Oxysorb further purifies the carrier. The nozzle pressure is measured by a pressure gauge such as a capacitance manometer 51.

In operation, helium or other inert carrier gas flows through the nozzle. the preferred nozzle pressures for the organic molecule jet lie between 1 and 10 torr, typical in JVD. The heating coil has many closely spaced turns (e.g., 20 mil nichrome wire with turns 2 mm apart) and encases nearly the full length of the nozzle; electric power delivered to the heating coil raises the nozzle temperature and efficiently heats the inflowing gas. The hot gas then heats the organic molecule reservoir and thermocouple.

In this way the entire nozzle interior, thermocouple and organic reservoir are at the same temperature; steady-state flow conditions assure that there are no temperature gradients, and that the organic reservoir temperature is stable and uniform. This configuration avoids the risk of decomposing the organic molecule either in the reservoir or in the vapor phase, and gives a jet source of organic molecules that is stable and strong. Any organic molecule that can be vaporized without decomposition is suitable. The number of such organic molecules is extremely large; examples we have proven are phthalocyanine and its metal derivatives, Rhodamine 6G and other laser dyes, Methyl Red and other colorants. Organic molecules vaporizing from the reservoir are caught in the carrier gas flow and swept out of the nozzle with the carrier gas jet.

A host such as $BaF_2$, $AlF_3$ or other species that may be evaporated as intact molecules, can be deposited from a single jet vapor source nearly identical to that just described for organics. The reservoir is loaded with powdered inorganic such as $BaF_2$; when the source is in operation molecules of $BaF_2$ are entrained in the carrier gas jet, and deposited downstream. Other hosts, for example, $SiO_2$, require reactive synthesis by two jets: a microwave discharge jet to decompose silane and deposit Si bearing molecular fragments, and an oxygen jet to convert the deposit to $SiO_2$.

In operation, the organic guest and inorganic host jet sources are mounted in the deposition chamber ports so that each jet flux is aimed perpendicular to substrates mounted on the carousel. As the carousel rotates and translates, each substrate passes in front of each jet in such a way that each element of substrate area is exposed for equal times to the same flux. As a consequence, the film thickness will be uniform over the entire substrate. Moreover, the distribution and relative local concentrations of the organic dopant within the inorganic host will also be uniform over the entire substrate.

The guest and host jet intensities are chosen to assure that the relative amounts of guest and host depositing produces a film in which the guest is dilute. In order to produce the correct proportions, the jet sources are calibrated individually. Calibration is done by measuring the thickness of the deposit from each jet, guest and host, in a given time; this is done with a profilometer such as the Sloan Dektak. The carousel rotation rate is made sufficiently high to assure that less than a monolayer of organic guest molecules deposits as the substrate passes through the guest jet. At the same time, the rotation is slow enough to assure that many monolayers of host will deposit per pass. Consequently, when the carousel completes a rotation, each substrate will have accumulated a dilute monolayer of guest which has been buried by many monlayers of host; this process, repeated over a prescribed time, generates the organic guest-inorganic host film of desired thickness. Typical operating conditions are: carousel rotation frequency: 1 to 10 Hz; axial scan frequency: 1 scan/min; scan amplitude: 3 inches.

An important feature of the present invention is that film growth is at room temperature. There is no risk of organic molecule decomposition. When a host vapor molecule such as $BsF_2$ condenses it releases energy which appears locally as "heat" or large vibrations of nearby atoms. Hosts that are hard ceramics have strong bonds, so when they form a large amount of energy is released. Energy released near a previously absorbed organic molecule might be sufficient to alter or decompose that molecule. If a host such as SiN or $SiO_2$ must be synthesized reactively for highly reactive species such as O and N atoms, the released energy is even larger. The present surface condensation process is quite different than the process which occurs in the aforementioned sol-gel liquid phase process where energy can be dissipated in three rather than two dimensions as in the surface of the present film.

It is not clear a priori that organic molecules will survive chemical interaction with O and N; atomic oxygen is nearly the strongest oxidizing agent and organic molecules "burn" or decompose readily. It has been found with the present invention that organic guests survive exposure to N atoms, but in general do not survive exposure to O atoms. Therefore, SiN can be used as a host very easily but the same is not true of $SiO_2$. Small sized organic compounds can be vaporized but in general it is difficult to vaporize most others. Moreover, it is not given that an organic jet is stable in long term operation. Until the present invention, a host guest film had never been fabricated by a vapor deposition process.

Figure 4:
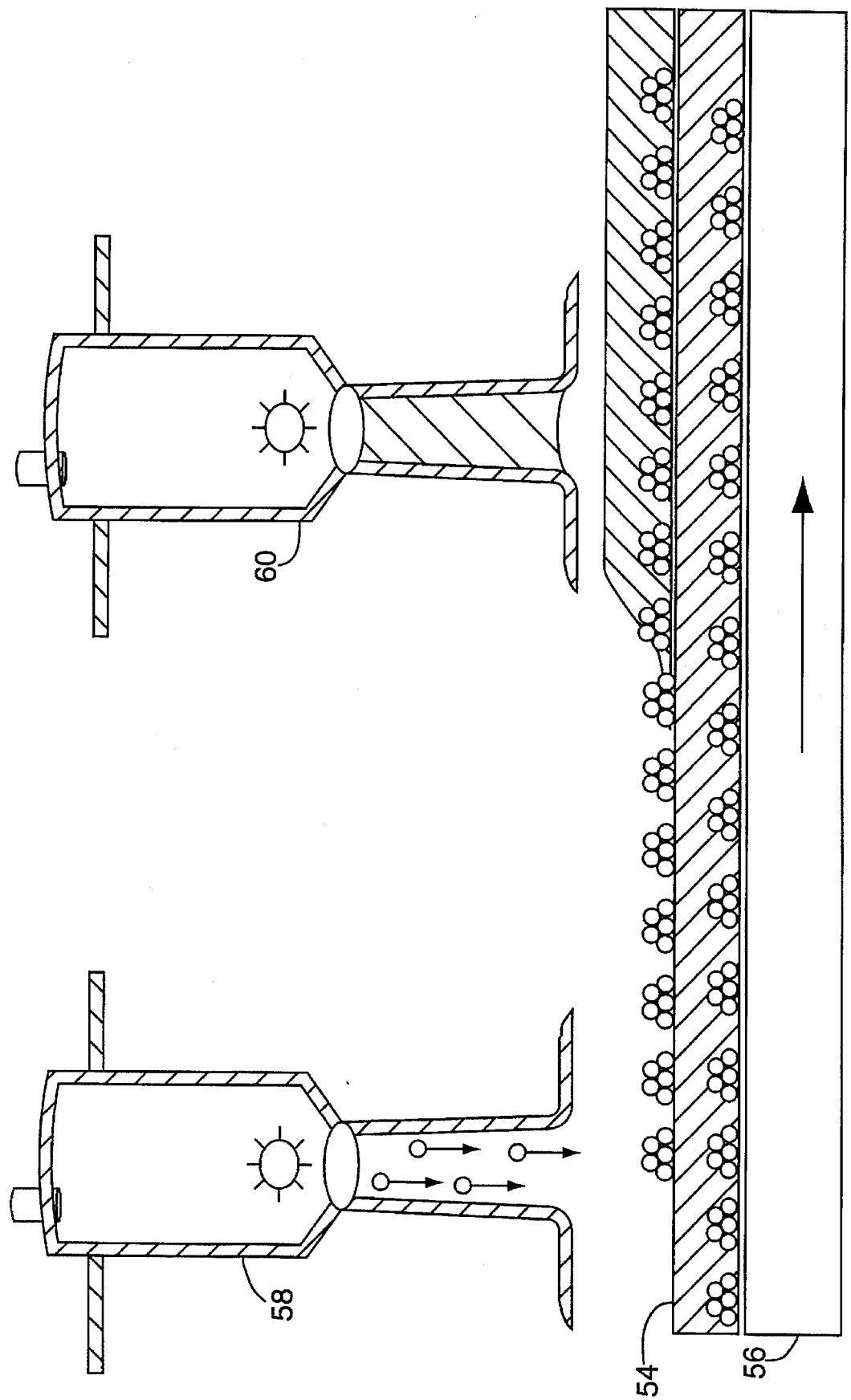
FIG. 4. shows schematically the growth of a host guest film by sequential deposition of guest and host layers.

FIG. 4 shows an organic guest-inorganic host film 54 being built up on a moving substrate 56 via deposition from a jet supplying the organic guest 58 and a jet supplying the inorganic host 60. The organic guest deposits as a submonolayer in which the individual molecules are separated; the inorganic host is a multilayer deposit typically 1–10 nanometers thick. FIG. 4 shows deposition of guest molecules on top of a previously deposited host layer and their subsequent burial by the next host layer.

This method and apparatus is used to make host-guest films using the following guests and hosts in different combinations. Typical hosts are: silicon dioxide, silicon nitride, magnesium oxide, zirconium oxide, barium fluoride, aluminum fluoride. Typical guests are: phthalocyanine and its copper and zinc derivatives, methyl red, Rhodamine 6G, and POPOP (1,4-di-[2(5-phenoxazolyl)]-benzene). Several working devices have been made with these organic guest inorganic host films, including a thin film passive waveguides and a thin film laser.

To make a SiN host for trapping Methyl Red or Rhodamine 6G guest a microwave discharge gas jet apparatus as described in the aforementioned patents is employed in part with the following parameters:

| | |
|---|---|
| Helium partial pressure | 500 millitorr |
| Nitrogen partial pressure | 60 millitorr |
| Silane (2% in helium) partial pressure: | 100 millitorr |

The pressures are as measured downstream but the relative values are the same in the microwave discharge region. The microwave power is approximately 65 watts, and pumping speed equal to 5000 liters/minute. Under these conditions a 1 micron film is grown over and approximate 100 cm2 with the guest trapped at concentrations of 1 to several per cent.

It can be seen that the present invention provides an apparatus and method for vapor depositing a class of films difficult to make by existing methods: organic guest- inorganic host thin films, in which the host is a hard, ceramic. These films have potential use in integrated electronics and optics. The deposition rates and throughputs provided by the present invention are larger than for any other method, and deposition is carried out in an apparatus that is simpler, more reliable, and less costly than other methods. A great number of organic dyes and complex molecules can be trapped in a wide variety of inorganic oxides, nitrides, fluorides, etc. Deposition can be done at room temperature, leaving thermally sensitive guests or substrates unharmed. There are no toxic precursors, solvents or effluents, since all film components are vaporized directly or synthesized cleanly in the chamber from elemental vapor. The method is compatible with vapor phase based integrated circuit manufacture to our knowledge, this is the only method suitable for both versatile research and, development of host-guest film technology and for high throughput device manufacture.

In sum, the present process and apparatus dramatically improves and extends Jet Vapor Deposition (JVD) techniques. In this regard it avoids the limitations of CVD and PVD while providing unique synthetic capabilities. The ability to quickly vapor deposit hard, ceramic films in the present invention is a key departure of the present invention over the prior art. Other host materials are inferior for realistic applications, and other methods are impractical and slow. Apart from the present invention, there exists no true vapor phase process for efficient, easy generation of organic-ceramic host-guest films.

Similarly, although the invention has been shown and described with respect to a preferred embodiment thereof, it should be understood by those skilled in the art that various other changes, omissions and additions thereto may be made therein without departing from the spirit and scope of the present invention. For example, nozzles for generating guest and host may have other sizes and shapes, and involve other mechanisms for producing vapor. The moving carousel may have larger or smaller diameter and height. The carousel may be held stationary, rather than moved, and the nozzle or jet moved instead. Several organic guests may be trapped together in the same host in the same manner as one guest. Multilayered films can be deposited by alternately operating different combinations of jet sources. Other extensions of the present technique will be evident to those skilled in the art.

I claim:

1. A method for vapor deposition of a film upon a substrate, said method comprising the steps of:

providing a vacuum chamber having a plurality of ports allowing for access to a vacuum chamber interior;

positioning the substrate within said vacuum chamber interior at a first substrate position;

depositing a host material portion of the film on said substrate by providing controlled entry of a host reactant gas into the interior of the vacuum chamber by means of a host gas jet apparatus affixed to a second vacuum chamber port, said host gas jet apparatus including:

a host nozzle having an interior cavity for providing, from a host nozzle tip, a supersonic jet of gas directly towards said substrate first position for at least a time needed to deposit a monolayer of host material, a means for providing carrier gas within said host nozzle interior cavity; and a means for providing host material reactant gas within said host nozzle interior cavity;

moving said substrate from said substrate first position to a substrate second position; and depositing a guest portion of the film on said substrate by providing controlled entry of a guest material reactant gas into the interior of the vacuum chamber by means of a guest gas jet apparatus affixed to a first vacuum chamber port, said guest gas jet apparatus including:

a guest nozzle having an interior cavity for providing, from a guest nozzle tip, a supersonic jet of gas directly towards a substrate second position for a time less than a time needed to allow molecules of said guest material to combine on said surface so that each of said molecules are spaced from one another and a monolayer of said guest material is avoided;

a means for providing carrier gas within said guest nozzle interior cavity; and a means for providing guest reactant gas within said guest nozzle interior cavity; and evacuating gas from said vacuum chamber to maintain a pressure in said vacuum chamber.

2. The method of claim 1 further comprising the steps of translating said substrate between said first and second substrate positions within a time less than a time needed to deposit a monolayer of said guest material but in a time greater than a time needed to deposit a monolayer of said host material.

3. The method of claim 2 further comprising the steps of providing a means for interrupting the presentation of said guest reactant gas jet while said substrate is in registration therewith, thereby ensuring the film includes a first host layer, a host-guest layer and a second subsequent host layer.

4. The method of claim 1 further comprising the step of translating said substrate between said first and second substrate positions to ensure the film is comprised of chemical reaction products of said first and second reactant gasses.

5. The method of claim 1 further comprising the step of providing said substrate substantially at room temperature.

6. The method of claim 1 wherein said guest reactant is nongaseous and said method further comprises the steps of:
providing said guest gas jet apparatus with a means for holding said guest material within said carrier gas jet such that nongaseous components remain in said holding means; and
providing a means for evenly heating said guest holding means.

7. The method of claim 5 further comprising the steps of:
provided said guest material in powdered form; and
providing said holding means with an enclosure having a plurality of spaced openings so as to prevent said powdered guest material from being blown from said enclosure by said carrier gas jet.

8. The method of claim 1 further comprising the steps of:
providing said substrate to an third substrate position; and
depositing a subsequent host portion of the film on said substrate by providing controlled entry of host reactant gas into the interior of the vacuum chamber by means of an subsequent third gas jet apparatus affixed to a third vacuum chamber port, said third gas jet apparatus including:
a third host nozzle having an interior cavity for providing, from a third host nozzle tip, a supersonic jet of gas directly towards said substrate third position for at least a time needed to deposit a monolayer of host material,
a means for providing carrier gas within said third host nozzle interior cavity; and
a means for providing host reactant gas within said third host nozzle interior cavity.

* * * * *

UNITED STATES PATENT AND TRADEMARK OFFICE
CERTIFICATE OF CORRECTION

PATENT NO. : 5,650,197
DATED : July 22, 1997
INVENTOR(S) : Bret Halpern

It is certified that error appears in the above-indentified patent and that said Letters Patent is hereby corrected as shown below:

Cover Page:

Item [56] References Cited: after "Schmitt" first reference cited, please insert --et al.--.

Signed and Sealed this

Twenty-third Day of December, 1997

Attest:

BRUCE LEHMAN

Attesting Officer

Commissioner of Patents and Trademarks